United States Patent
Yang et al.

(10) Patent No.: US 7,342,296 B2
(45) Date of Patent: Mar. 11, 2008

(54) WAFER STREET BUFFER LAYER

(75) Inventors: Wen-Kun Yang, Hsin-Chu (TW); Jui-Hsien Chang, Hsinchu (TW)

(73) Assignee: Advanced Chip Engineering Technology Inc., Hsinchu County (TW)

( * ) Notice: Subject to any disclaimer, the term of this patent is extended or adjusted under 35 U.S.C. 154(b) by 101 days.

(21) Appl. No.: 11/293,104

(22) Filed: Dec. 5, 2005

(65) Prior Publication Data
US 2007/0128835 A1    Jun. 7, 2007

(51) Int. Cl.
*H01L 29/40*    (2006.01)
*H01L 21/00*    (2006.01)

(52) U.S. Cl. ................ 257/620; 438/113; 257/E23.123
(58) Field of Classification Search .................. 438/33, 438/113, 112, 126, 127; 257/620, 772, 787
See application file for complete search history.

(56) References Cited

U.S. PATENT DOCUMENTS

| | | | |
|---|---|---|---|
| 6,207,477 B1 * | 3/2001 | Motooka et al. | 438/113 |
| 7,144,760 B2 * | 12/2006 | Hanaoka | 438/113 |
| 2003/0100143 A1 * | 5/2003 | Mulligan et al. | 438/113 |
| 2004/0121563 A1 * | 6/2004 | Farnworth et al. | 438/465 |

* cited by examiner

*Primary Examiner*—W. David Coleman
(74) *Attorney, Agent, or Firm*—Birch, Stewart, Kolasch & Birch, LLP

(57) ABSTRACT

The present invention provides a separating process of a semiconductor device package of wafer level package. The method comprises a step of etching a substrate to form recesses. Then a buffer layer is formed on the first surface of the substrate, wherein the buffer layer is filled with the corresponding recesses to form infillings on adjacent the semiconductor device package. Dicing the wafer into individual package along substantial center of said infillings, the step may avoid the roughness on the edge of each die and also decrease the cost of the separating process.

10 Claims, 4 Drawing Sheets

WAFER STREET BUFFER LAYER

BACKGROUND OF THE INVENTION

1. Field of the Invention

This invention relates generally to semiconductor device packaging, and more particularly to a dicing method of semiconductor devices package for dividing a wafer or panel into discrete package.

2. Description of the Prior Art

In the electronic component world, integrated circuits (IC's) are typically fabricated on a semiconductor substrate, known as a chip, and most commonly are made of silicon. The silicon chip is typically assembled into a larger package, which serves to provide effective enlargement of the distance or pitch between input/output contacts of the silicon making it suitable for attachment to a printed circuit board, and to protect the IC from mechanical and environmental damage.

Conventionally, ICs are packaged one by one after dicing from a wafer. A wafer level package (WLP) or a chip scale package (CSP) was developed to provide an alternative solution to directly attached flip chips devices, and plurality of dice are separated into individual devices after they are packaged. Die separation, or dicing, by sawing is the process of cutting a semiconductor substrate into its individual die. Wafer dicing technology has progressed rapidly to satisfy every packaging requirement, such as high throughput, high yield and low cost.

As shown in FIG. 1, it is a side view of plurality of flip chip devices 100 in a wafer according to prior art. The flip chip 100 comprises a die 105 with metal pads 106 that typically has a conventionally fabricated IC device structure. A buffer layer 103 is formed on a substrate 102 and adjacent to the die 105. The die 105 is adhered on the substrate 102 through an adhesive layer 104, and the die 105 has a plurality of electrical connections 108, such as redistribution layer (RDL) trace. Bumps, such as solder balls 107, are formed on the electrical connections 108. A protection layer 109 covers the electrical connections 108 to expose a portion of the electrical connections 108 for allowing the solder balls 107 formed thereon. Moreover, a buffer film 101 is applied to the bottom surface of the substrate 102.

Devices 100 are generally separated from each other and the rest of the panel by a saw blade cutting along the dash line 110 from the surface having the solder balls 107. The dicing blade is usually made of some hard materials, there are some kinds of blades available commercially: (1) sintered diamond blade, in which diamond particles are fused into a soft metal such as brass or copper, or incorporated by means of a powdered metallurgical process; (2) plated diamond blade, in which diamond particles are held in a nickel bond produced by an electroplating process; (3) resinoid diamond blade, in which diamond particles are held in a resin to create a homogeneous matrix. Silicon wafer dicing is dominated by the plated diamond blade, which has proved most successful for this application.

While saw cutting of wafers and panel is the conventional industry standard, there remain drawbacks with such cutting. Saw blade wear over time. This results in inconsistent cutting quality from when the blade is new and subsequent cutting operations. Consequently, the operator must predict when the blade has reached the end of its useful lifetime. This cannot be predicted accurately. Accordingly, the saw blades may be changed before the end of their useful lives resulting in higher equipment costs than necessary due to premature saw blade replacement. Moreover, saw blades introduce mechanical stresses in the workpiece while sawing, especially at the surfaces of the workpiece. Due to these stresses saw blade may not be used to cut very thin workpiece, such as ultrathin semiconductor wafers. Increasing use of integrated circuits (IC's) technology in microwave and hybrid circuits, memories, computers, defense and medical electronics has created new difficult problems for the industry.

The other drawback of using saw is time consuming. It usually takes 2 to 3 hours to process a wafer. It affects not only the throughput of products, but the cost of processing a wafer and panel.

The cost of the method of dicing wafer using the saw blade is higher due to the blades are not ordinary blades, they are more expensive than general knifes. It costs about US$60 dollars for one dicing blade, and each dicing machine has more than one blade depending on the design.

There is still a drawback by a dicing saw with a saw blade. Each die will have a roughness edges by such method. It is because that the cutting process is an abrasive machining process similar to grinding and cutoff operations, the edges of each die are usually very rough and easy chipping.

In view of the aforementioned, the present invention provides an improved method of separating package for WLP to overcome the above drawbacks.

SUMMARY OF THE INVENTION

To achieve the foregoing and other objects and according to the purpose of the present invention, a semiconductor device package dicing method for fabricating the same are disclosed.

The dicing method of semiconductor device package of the present invention can avoid the roughness on the edge of each package after dicing with a dicing saw.

The dicing method of the present invention may avoid the high cost owing to using a dicing saw.

The dicing method of the present invention may reduce cycle time throughout the dicing process.

The present invention provides a method for separating IC packages on a substrate of a wafer level package. The method comprises: (a) removing or etching a portion of the substrate to form recesses; (b) forming a buffer layer on the first surface of the substrate, the recesses facing to conductive balls of the IC packages, wherein the buffer layer is filled with the corresponding recesses and formed infillings on adjacent to the IC packages; and (c) cutting the IC packages along substantial center area of the infillings.

The material of the buffer layer comprises photo epoxy, silicone rubber, silicone resin, elastic PU, porous PU, acrylic rubber, blue tape or UV tape. The etching step comprises wet etching process by the etching solution comprising ferric chloride, cupric chloride, and ammonium persulfate. The material of the substrate in the etching step comprises silicon, glass, alloy 42, quartz or ceramic. The cutting step may be performed by a mechanical force.

In another aspect, the present invention discloses a semiconductor device package structure. The structure comprises a substrate having a recess; a first buffer layer formed on the substrate and filled with the recess to form infilling; a die formed on the first buffer, wherein the die aligns substantially edge of the recess and has a plurality of electrical connections on a first surface of the die; and, a plurality of conductive balls coupled to the connections, and the recesses facing to the conductive balls.

The structure further comprises a second buffer layer configured over the substrate.

The above-mentioned buffer layer may reach the function to avoid the die or substrate from damaging when the side part of the die or substrate collides with an external object.

BRIEF DESCRIPTION OF THE DRAWINGS

The above objects, and other features and advantages of the present invention will become more apparent after reading the following detailed description when taken in conjunction with the drawings, in which.

DESCRIPTION OF THE PREFERRED EMBODIMENT

Method and structure for manufacturing a semiconductor device (such as integrated circuit) or a substrate is described below. In the following description, numerous specific details are set forth in order to provide a thorough understanding of the present invention, and the scope of the present invention is expressly not limited expect as specified in the accompanying claims.

Figure 2:
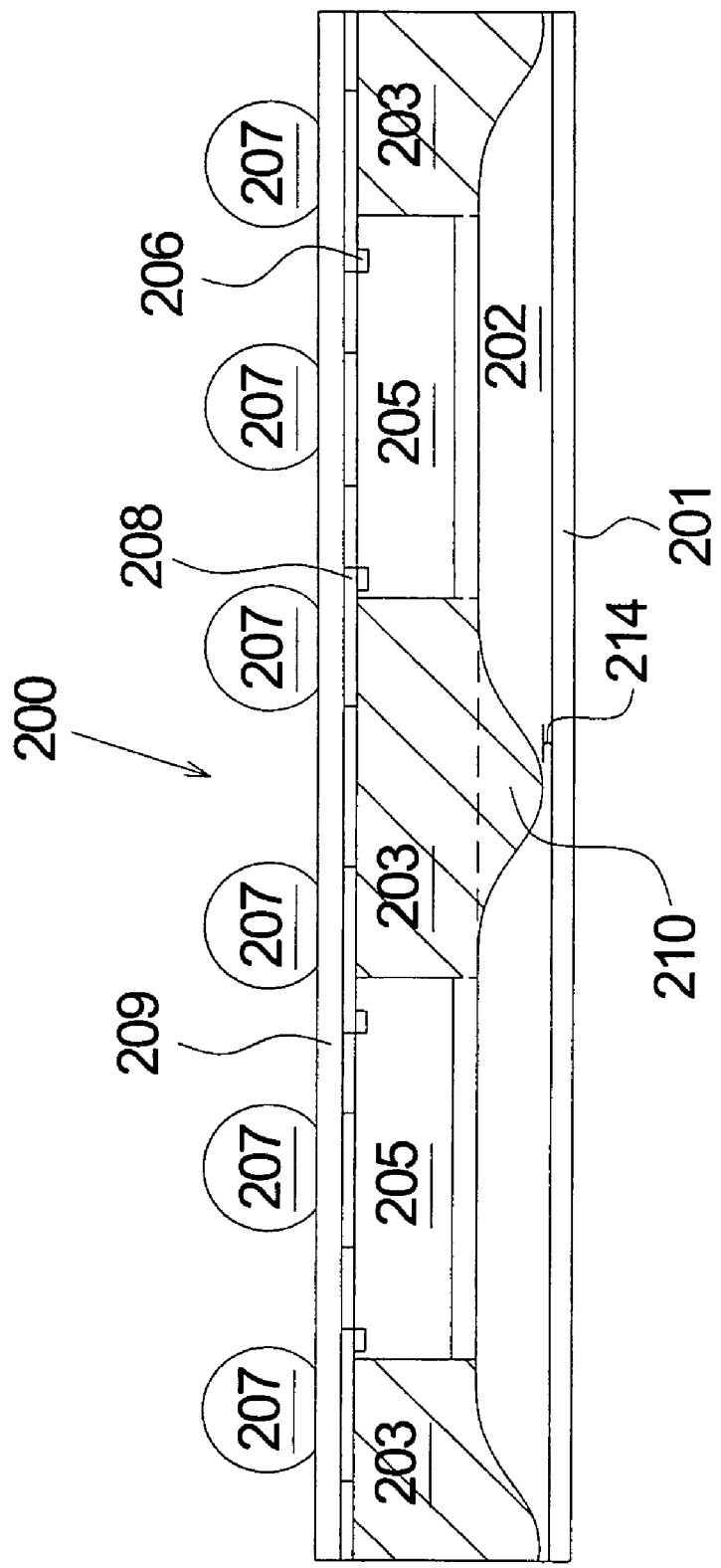
FIG. 2 is a schematic diagram of a semiconductor wafer according to the present invention.

Referring to FIG. 2, the wafer 200 comprises plurality of chip 205 with metal pads 206 and contact metal balls 207 formed thereon and electrically coupled with a print circuit board (not shown). A protection layer 209 covers the electrical connections 208 to expose a portion of the electrical connections 208 for allowing the contact metal balls 207 formed thereon.

A backside surface of the chip 205 is directly adhered on a substrate 202 with recesses substantially aligned to a first buffer layer 203. The recesses may be formed by using a wet etching process prior to the adhesion to the wafer 200. Namely, the recess 210 is preliminarily formed within the substrate 202 before attaching the wafer 200 on the substrate 202. The recesses face to the contact metal balls 207. The drawback of using saw can be overcome by the structure with recess that faces to the surface having balls 207, and the recess 210 filled with material 203 may reduce the cutting time due to the material is softer than metal. Further, the cost of the method will be reduced due to the recess with the material of buffer layer 203. The cutting line is aligned to the recess, thus, the life time of the blade can be extended. The roughness edges of conventional method may be overcome also In one embodiment, the thickness of the remains 214 of the substrate 202 after etching process is 10~50 um. The etching solution may comprise ferric chloride, cupric chloride, and ammonium persulfate. The material for the first buffer layer 203 is formed on the substrate 202 and filled within the corresponding recesses, thereby forming infillings 210 adjacent to the chip 205. The pre-formed recess 210 is like a dam to receive the overflow buffer layer. It should be note that the dimension of the substrate 202 is larger than the one of the chip 205. The electrical connections 208 are metal alloy, for example Ti/Cu alloy formed by sputtering and/or Cu/Ni/Au alloy formed by electroplating. The material of the first buffer layer 203 comprises an elastic material, such as photo epoxy, silicone rubber, silicone resin, elastic PU, porous PU, acrylic rubber, blue tape or UV tape. The substrate 202 comprises but not limited to silicon, glass, alloy 42, quartz or ceramic. Again, alloy 42 in is nickel-ferrum (Ni—Fe) alloy consisting of 42% nickel and 58% ferrum. In one embodiment, the thickness of the substrate 202 is 120~150 um.

In one embodiment, the further step of the dicing method according to the present invention is to print a second buffer layer 201 on the backside of the substrate 202. In one embodiment, the thickness of the second buffer layer 201 is 20~70 um. The infillings 210 are located between each chip 205 and substantially aligned to the first buffer layer 203 among the chip 205. The distance between each infillings 210 is substantially fixed, and depends on the size of each device package after dicing. The depth of each infilling 210 is substantially equal to the thickness of the substrate 202.

The material of the second buffer layer 201 comprises photo epoxy, silicone rubber, silicone resin, elastic PU, porous PU, acrylic rubber, blue tape or UV tape.

Figure 3:
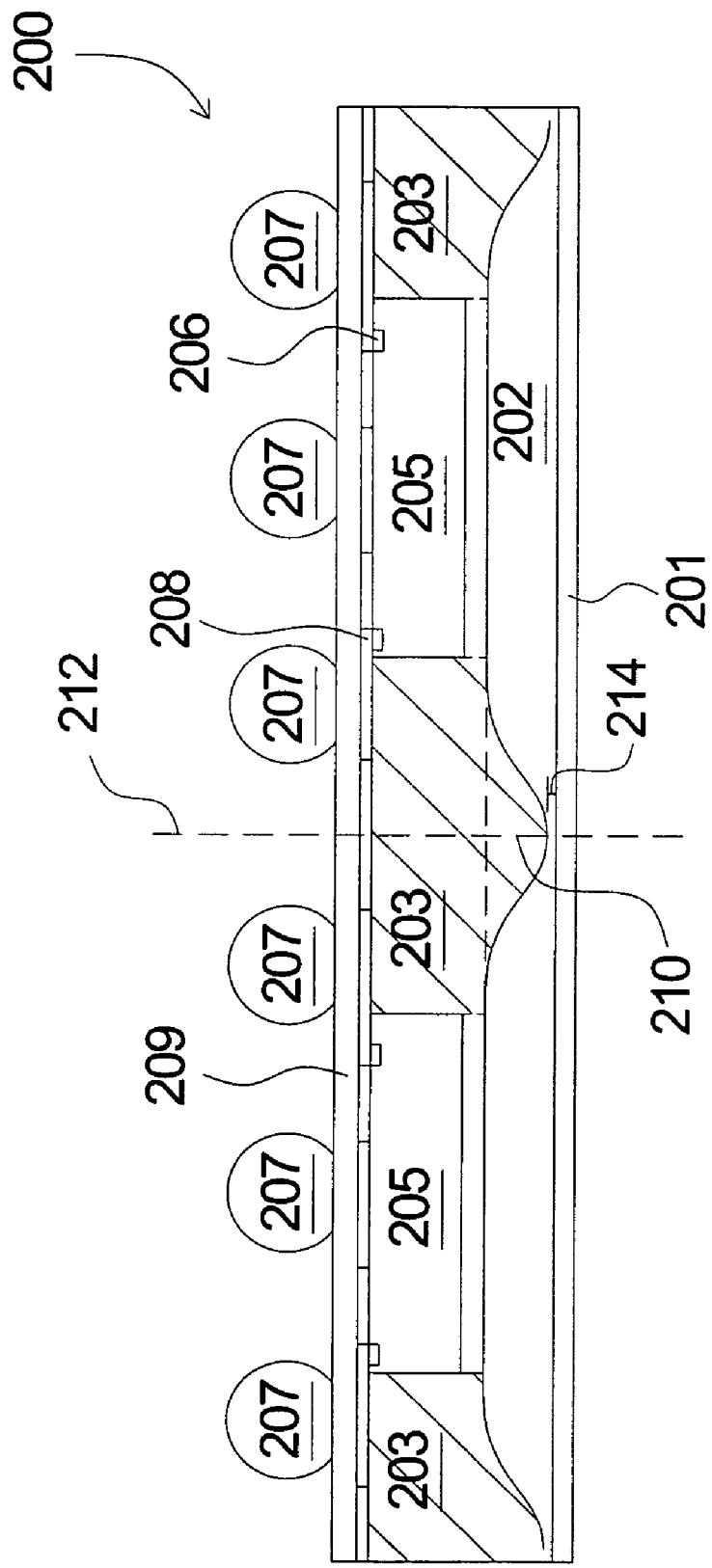
FIG. 3 is a schematic diagram of a semiconductor wafer according to the present invention.

Referring to FIG. 3, the next step of the dicing method according to the present invention is to cut the wafer 200 along cutting lines 212. The cutting lines 212 are approximately in the center of the infillings 210. The cutting step can be performed by a mechanical force from the side having solder balls 207. The cutting step also can be performed from another side of the wafer 200. The material of buffer layer 203 comprises silicon rubber, which can be easily cut through by any kind of knifes, such as an art designing knife.

Figure 4:
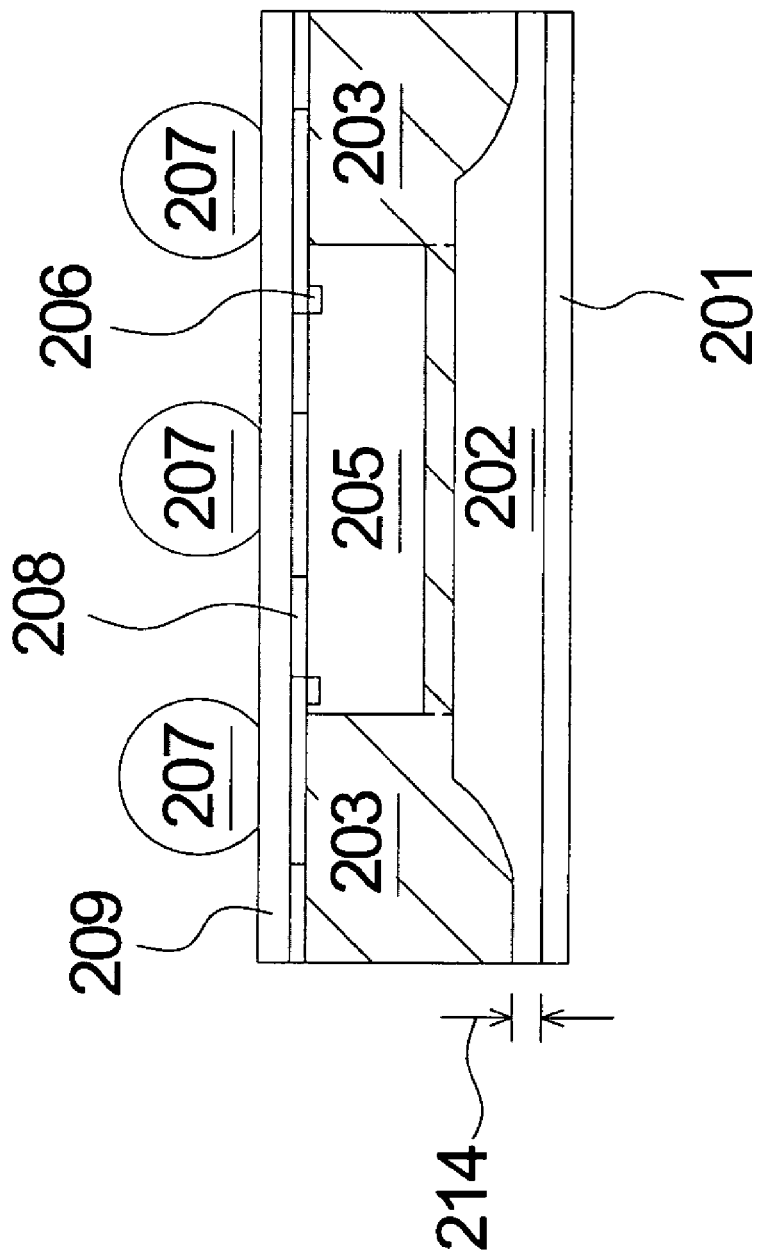
FIG. 4 is a schematic diagram of an individual semiconductor device package structure according to the present invention.

After the cutting process of the present invention, the panel (wafer) is separated into individual package, which is shown in FIG. 4. In FIG. 4, the substrate 202 is etched to form a recess adjacent to the edge of the chip 205. The first buffer layer 203 is formed on the substrate 202 and filled with the recess to form infilling 210. The die 205 aligns substantially the edges of the recess. The package structure of the die 205 is processed with the remains 214 of the substrate 202.

The buffer layer 201 may reach the function to reduce the die from being lateral damage due to less contact area of the die when the side part of the dice collides with a lateral external object.

Figure 1:
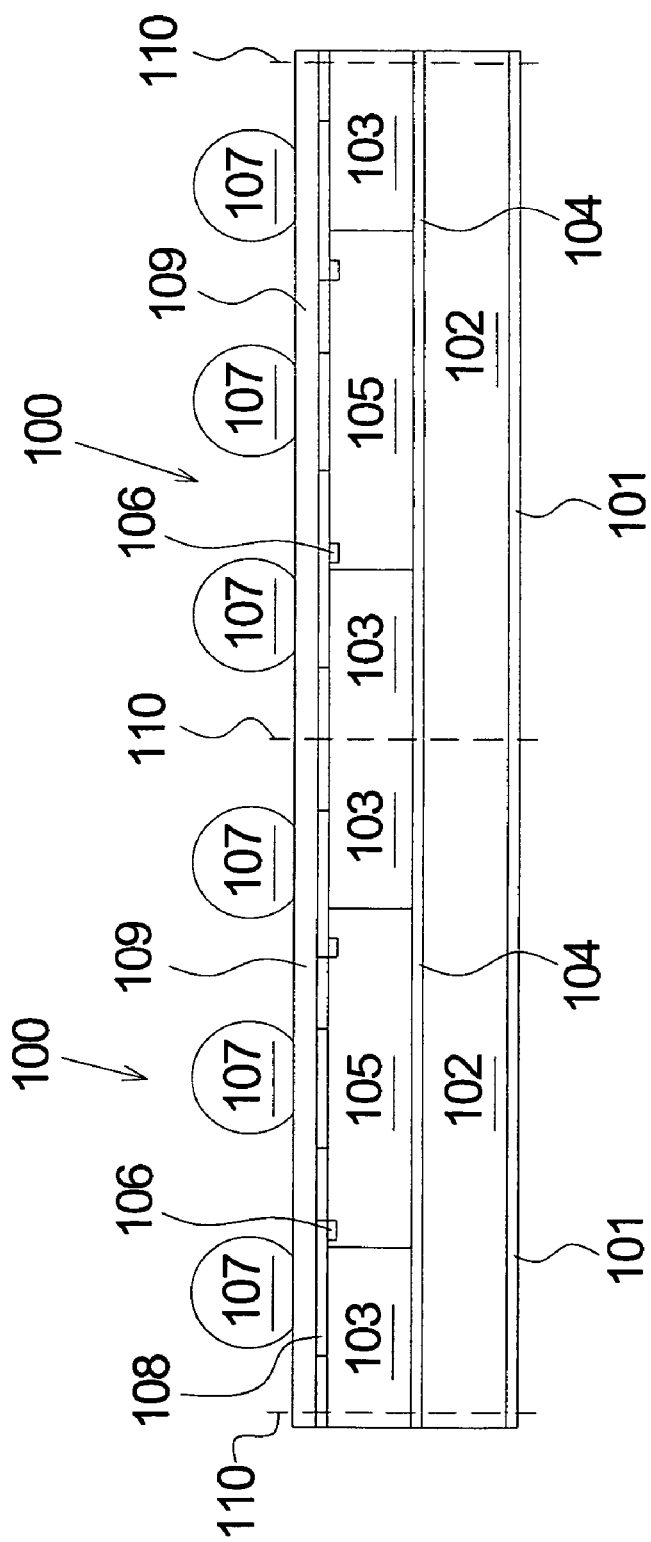
FIG. 1 is a diagrammatic side view of a fan-out wafer (panel) level package according to the prior art.

The structure of the die 205 is different from general dice dicing by well-known technology as shown in FIG. 1. The width of each layers of the die 105 cut by general dicing saw is substantially equal, and the edge of the die 105 may be rough due to the general effect of sawing process.

Hence, the aforementioned semiconductor device package structure dicing by the method according to the present invention is different with general device structure performed by conventional dicing method. In the present invention, the edge of general device structure is smooth because all layers are cut at the same time. There is recess existing within the substrate. And this special structure can be used to determine whether a device is diced by the method according to the present invention.

Although specific embodiments have been illustrated and described, it will be obvious to those skilled in the art that various modifications may be made without departing from what is intended to be limited solely by the appended claims.

What is claimed is:

1. A method for separating IC packages on a wafer for a wafer level package, comprising:

forming recesses within a substrate;

attaching said wafer by using a buffer layer on the first surface of said substrate, said recesses facing to conductive balls of said IC packages;

wherein said buffer layer is filled within said recesses, thereby forming infillings adjacent to said IC packages; and cutting said IC packages along substantial center area of said infillings.

2. The method in claim 1, wherein the material of said buffer layer comprises photo epoxy, silicone rubber, silicone resin, elastic PU, porous PU, acrylic rubber, blue tape or UV tape.

3. The method in claim 1, wherein said forming recess step comprises etching process.

4. The method in claim 1, wherein the material of said substrate in said forming recess step comprises silicon, glass, alloy 42, quartz or ceramic.

5. The method in claim 1, wherein said cutting step is performed by a mechanical force.

6. A semiconductor device package structure, comprising:
a substrate having a recess;
a first buffer layer formed on said substrate and filled within said recess to form infilling;
a die formed on said first buffer, wherein said die aligns substantially edges of said recess and has a plurality of electrical connections on a first surface of said die; and
a plurality of conductive balls coupled to said connections, said recesses facing to said conductive balls.

7. The structure in claim 6, further comprising a second buffer layer configured over said substrate.

8. The method in claim 6, wherein the material of said first buffer layer comprises photo epoxy, silicone rubber, silicone resin, elastic PU, porous PU, acrylic rubber, blue tape or UV tape.

9. The method in claim 7, wherein the material of said second buffer layer comprises photo epoxy, silicone rubber, silicone resin, elastic PU, porous PU, acrylic rubber, blue tape or UV tape.

10. The method in claim 6, wherein the material of said substrate comprises silicon, glass, alloy 42, quartz or ceramic.

* * * * *